United States Patent
Moschopoulos et al.

(10) Patent No.: US 9,747,078 B2
(45) Date of Patent: Aug. 29, 2017

(54) TRUE RANDOM NUMBER GENERATION IN SYSTEMS ON CHIP

(71) Applicant: Dialog Semiconductor B.V., 's-Hertogenbosch (NL)

(72) Inventors: Nikolaos Moschopoulos, Athens (GR); Jan Geert Prummel, Eindhoven (NL); Michail Papamichail, Eindhoven (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/884,320

(22) Filed: Oct. 15, 2015

(65) Prior Publication Data
US 2016/0110166 A1  Apr. 21, 2016

(30) Foreign Application Priority Data
Oct. 16, 2014 (DE) .......................... 10 2014 221 083

(51) Int. Cl.
*H03M 1/20* (2006.01)
*G06F 7/58* (2006.01)
(Continued)

(52) U.S. Cl.
CPC ........... *G06F 7/588* (2013.01); *H03M 1/0641* (2013.01); *H03M 1/12* (2013.01)

(58) Field of Classification Search
CPC .... H03M 1/0641; H03M 1/12; H03M 1/1061; H03M 1/0639; H03M 1/201
(Continued)

(56) References Cited

U.S. PATENT DOCUMENTS 5,784,002 A * 7/1998 Roehr ................... H04L 12/413
                                                      370/431
7,015,851 B1 * 3/2006 Bruhns ............... H03M 1/0646
                                                      341/131
(Continued)

FOREIGN PATENT DOCUMENTS

EP         1253513        10/2002
WO      WO 02/05444        1/2002

OTHER PUBLICATIONS

"A Noise-Based IC Random Number Generator for Applications in Cryptography," by Craig S. Petrie, et al., IEEE Transactions on Circuits and Systems—I: Fundamental Theory and Applications, vol. 47, May 2000, pp. 615-621.

*Primary Examiner* — Linh Nguyen
(74) *Attorney, Agent, or Firm* — Saile Ackerman LLC; Stephen B. Ackerman

(57) ABSTRACT

A device for true random number generation is disclosed. The device comprises an antenna and an analog processing unit for analog processing of a signal received from the antenna. An analog to digital (AD) converter is used for converting an analog signal generated by the analog processing unit into a digital signal. An isolation means is applied for temporarily isolating the antenna from the analog processing unit and the AD converter to generate a noise signal. A sampling means is used for sampling output values generated by the AD converter when the antenna is isolated from the analog processing unit and the AD converter. A digital processing unit is used for processing the sampled output values generated by the AD converter. The digital processing unit is configured to generate a random number based on one or more of the output values generated by the AD converter.

23 Claims, 3 Drawing Sheets

(51) Int. Cl.
*H03M 1/12* (2006.01)
*H03M 1/06* (2006.01)

(58) Field of Classification Search
USPC .................. 341/118, 120, 121, 131, 155
See application file for complete search history.

(56) References Cited

U.S. PATENT DOCUMENTS

| | | | | |
|---|---|---|---|---|
| 2004/0063417 A1* | 4/2004 | Binshtok | .................. | H04B 1/30 455/314 |
| 2005/0008154 A1* | 1/2005 | Sarkar | .................... | G06F 7/588 380/45 |
| 2006/0068739 A1* | 3/2006 | Maeda | .................... | H04B 1/30 455/295 |
| 2006/0094385 A1* | 5/2006 | Rafati | ................. | H04B 7/0848 455/272 |
| 2007/0050437 A1* | 3/2007 | Krayer Pitz | ............. | G06J 1/00 708/250 |
| 2007/0060079 A1* | 3/2007 | Nakagawa | ............ | H04J 3/0682 455/131 |
| 2007/0180009 A1* | 8/2007 | Gutnik | .................. | H04L 9/0861 708/250 |
| 2008/0096514 A1* | 4/2008 | Rahman | ............. | H03H 11/1291 455/307 |
| 2008/0288845 A1* | 11/2008 | Tsfati | .................... | H03M 13/09 714/748 |
| 2009/0262877 A1* | 10/2009 | Shi | ......................... | H03L 1/022 375/376 |
| 2011/0117870 A1* | 5/2011 | Pera | ..................... | H04B 1/1036 455/307 |
| 2012/0221615 A1* | 8/2012 | Cerf | ....................... | G06F 7/588 708/250 |
| 2013/0065546 A1* | 3/2013 | Ruijter | ................ | H04B 17/309 455/230 |
| 2013/0114646 A1* | 5/2013 | Nitta | ..................... | G01S 19/30 375/147 |
| 2013/0141260 A1* | 6/2013 | Lai | ...................... | H03M 1/1014 341/110 |
| 2013/0334983 A1* | 12/2013 | Tanigawa | ............ | H05B 37/02 315/297 |

* cited by examiner

TRUE RANDOM NUMBER GENERATION IN SYSTEMS ON CHIP

TECHNICAL FIELD

The invention relates to true random number generation.

BACKGROUND

Security in modern System on Chips (SoC) is becoming more important, among others because IoT (Internet of Things) is rapidly growing both in infrastructure and end-point applications. Short range low power wireless communications being the most important leaf of IoT, secure connections are highly desired, since vital information might be transmitted. Hence, a SoC may be equipped with a strong processor providing enough processing power for cryptography algorithms or the necessary hardware accelerators to speed up these processes. However, the initial step before even getting into the cryptography world is the generation of a digital word which is random, i.e. there is enough entropy and randomness to guarantee that all possible word values are generated with almost equal probability, and furthermore, the values are independent of each other, i.e. the next value cannot be predicted, regardless of how many words have already been produced. This random word is usually called "the seed" and is used for the generation of the cryptography keys in later stages.

There are a lot of ways to create seeds, mostly based on the Flip-Flops metastability effect which provides randomized results on its digital output or on memory array digital noise while powering up of the system. They all need special hardware to generate a true random number. There are other ways like digitizing environmental data (e.g. monitor a floating analog chip's pin or check RSSI values) but they are either inadequate in entropy/randomness or spend a long time for gathering a good seed. Moreover, the result may be sensitive to 'tampering'. For example, external stimuli may influence the result.

Therefore, an improved true random generator would be desirable.

SUMMARY

In a first aspect, the invention provides an improved true random number generator. Such a true random number generator could comprise:
an antenna;
an analog processing unit for analog processing of a signal received from the antenna;
an analog to digital (AD) converter for converting an analog signal generated by the analog processing unit into a digital signal;
isolation means for temporarily isolating the antenna from the analog processing unit and the AD converter to generate a noise signal;
sampling means for sampling output values generated by the AD converter when the antenna is isolated from the analog processing unit and the AD converter; and
a digital processing unit for processing the sampled output values generated by the AD converter.

The sampled output values contain true randomness, as the influence of interference has been largely eliminated by isolating the antenna from the analog processing unit, so that the analog processing unit processes largely random noise. Consequently, at least a part of the sampled output values (for example one or more bits of the sampled output values) is random. Moreover, the analog processing unit that is already present in communication systems in order to process communication signals transceived with the antenna can be re-used to generate a random number. Also, the system can be used to generate a seed in SoCs or other hardware with an embedded radio transceiver by utilizing hardware which is usually present for the testability of the radio itself. The system may be able to provide a good seed in a short time, and may help to implement security protocols running in deeply embedded systems in IoT. However, the invention is not limited to these example applications.

The digital processing unit may be configured to generate a random number based on one or more of the output values generated by the AD converter. A simple example use is to generate a random number based on the sampled output value or values.

The analog processing unit may comprise a filter having a gain larger than 0 dB. In other words, the filter performs amplification. As the antenna is isolated from the analog processing unit, mainly noise is amplified, which is suitable for generating a true randomness.

The filter may be configured to operate at an increased filter bandwidth while the output values are generated. This may accelerate acquisition of random bits.

The antenna may be connected to the analog processing unit via at least one of a low-noise amplifier (LNA) and a mixer. The isolation means may be configured to temporarily and simultaneously isolate the antenna and the at least one of the LNA and the mixer (or both) from the analog processing unit and the ADC. The digital processing unit may be configured to process output values of the AD converter sampled when the antenna and the LNA and/or the mixer are isolated from the analog processing unit and the ADC. This is a suitable configuration, allowing to re-use the analog processing unit that (in normal operation) processes a signal from the LNA and/or mixer so that the analog processing unit can also be used for the random number generation.

The device may comprise a demodulator for demodulating the output values generated by the AD converter when the antenna is electrically connected to the analog processing unit. This is a suitable configuration, in which the analog processing unit can be a processing unit that can process signals from LNA and/or mixer to prepare the signals for the demodulator.

The digital processing unit may be configured to base the random number on one or more selected bits of the output values generated by the AD converter. The one or more selected bits may be the bits containing the most randomness. For example, the least significant bits may be the bits containing the most randomness. For example, the one least significant bit may be used, the two least significant bits, or the four least significant bits. In another example, the $2^{nd}$ and $3^{rd}$ least significant bits may be used. These numbers are only examples.

The sampling unit may be configured to sample the output of the AD converter at time points that are separated from each other by at least a predetermined time duration, which time duration is longer than a time duration in which the output values of the AD converter exhibit a significant autocorrelation. This way an unwanted effect of any autocorrelation of sampling points that are close to each other in time may be eliminated.

The AD converter may be configured to output values (such as poly-phase values) in a plurality of channels (for example, an I-channel and a Q-channel). The digital processing unit may be configured to determine the random number based on values corresponding to a selected channel (for example, either one of the I-channel or Q-channel values). In case the device implements poly-phase channels (such as I-channel and Q-channel), the processing of these channels could be entirely separate. However, in normal operation these channels may depend on each other and/or there may be information exchange between the two channels. To avoid correlation of values used for random number generation, the digital signal processing unit could discard one of the channels and use only values generated by one of the channels (either the I or the Q channel, for example).

Alternatively, the analog processing unit and the AD converter may be capable of temporarily decoupling the processing paths of the channels (for example, decoupling a processing path of the I-channel and a processing path of the Q-channel). In such a case, the digital processing unit may be configured to determine the random number based on the poly-phase output values of the plurality of channels (for example, both the I-channel and the Q-channel values), when the processing paths are decoupled. Moreover, if the device is constructed such that the processing paths of the channels (for example, the I-channel and the Q-channel) are always decoupled, the random number may also be based on a combination of all the values of the plurality of channels (for example, a combination of both the I-channel and Q-channel values). It will be understood that these example configurations are only provided to illustrate some advantageous examples, but these examples do not limit the invention.

The digital processing unit may be configured to sample the output values generated by the AD converter using a random sampling scheme. The random sampling scheme may remove influence of any remaining unwanted periodicities in the signal generated by the AD converter.

The digital processing unit may be configured to determine a sampling index for sampling the output value generated by the AD converter in dependence on a previous output value generated by the AD converter. This is one way to obtain a random sampling scheme.

The digital processing unit may be configured to determine the sampling index for sampling the output value relating to a first channel and generated by the AD converter in dependence on a previous output value relating to a second channel and generated by the AD converter, wherein the first and second channel are different channels that are both selected from I-channel and Q-channel, and wherein the output value relating to the first channel is processed to generate a random number in dependence on the output value relating to the first channel. This is another way to obtain a random sampling scheme.

According to another aspect of the invention, a method of generating a random number may be provided. The method comprises generating a noise signal with an analog processing unit by temporarily isolating an antenna from the analog processing unit and an analog to digital (AD) converter;

converting an analog signal generated by the analog processing unit into a digital signal by the AD converter;

sampling the digital signal when the antenna is isolated from the analog processing unit and the AD converter to obtain sampled output values; and processing the sampled output values.

According to another aspect of the invention, a computer program product for being executed by a controller may be provided. The computer program may contain instructions to cause a controller, when executing the program, to control:

generating a noise signal using an analog processing unit by temporarily isolating an antenna from the analog processing unit and an analog to digital (AD) converter;

converting an analog signal generated by the analog processing unit into a digital signal by the AD converter;

sampling the digital signal when the antenna is isolated from the analog processing unit and the AD converter to obtain sampled output values; and processing the sampled output values.

The person skilled in the art will understand that the features described above may be combined in any way deemed useful. Moreover, modifications and variations described in respect of the system may likewise be applied to the method and to the computer program product, and modifications and variations described in respect of the method may likewise be applied to the system and to the computer program product.

BRIEF DESCRIPTION OF THE DRAWINGS

In the following, aspects of the invention will be elucidated by means of examples, with reference to the drawings. The drawings are diagrammatic and may not be drawn to scale.

DESCRIPTION

Figure 1:
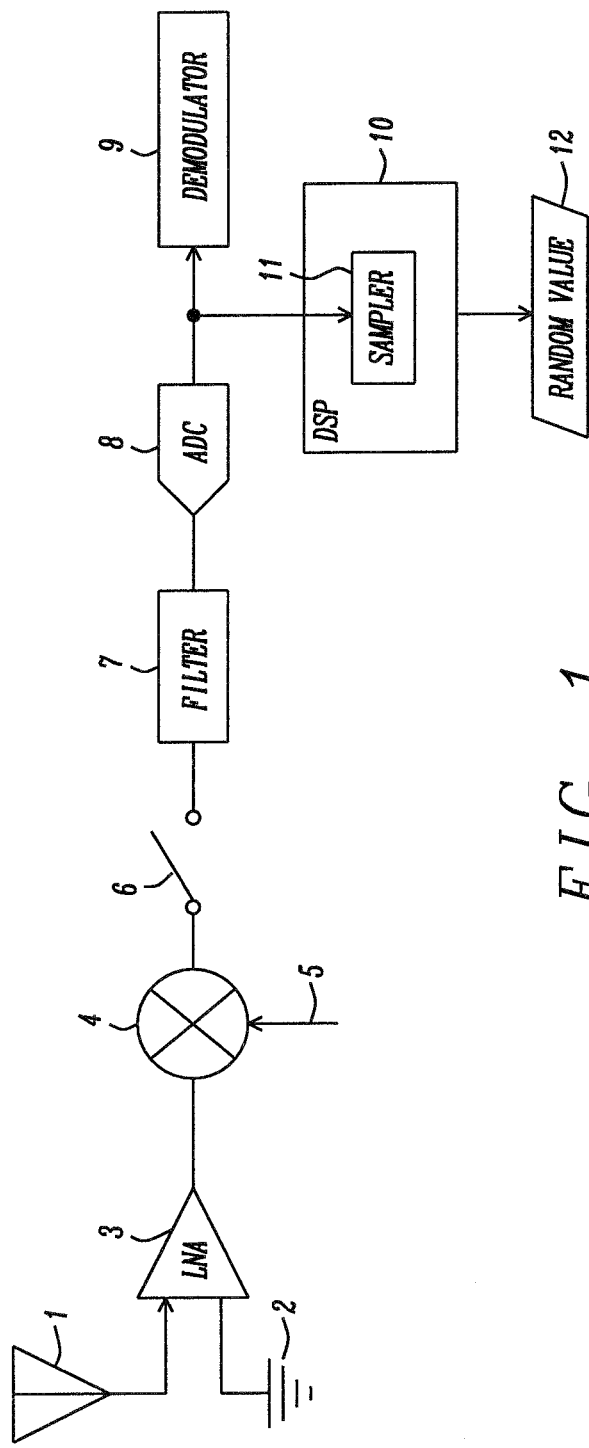
FIG. 1 is a diagram of a device for true random number generation.

FIG. 1 shows relevant parts of a device for true random number generation. The device has a connection for an antenna 1, and a connection to ground 2. When present, the antenna is connected to the low-noise amplifier (LNA) 3. The output of the LNA is connected to a mixer 4 which mixes the output signal of the LNA with another signal 5 (usually generated by another portion of the device, not shown). The output of the mixer is connected to a filter 7, which is an example of an analog processing unit. Other examples of analog processing units that could be used instead of a filter include low-pass filters, band-pass filters, intermediate frequency amplifiers, variable-gain amplifiers, and limiters. The filter may have an amplifying function, i.e. the gain may be greater than 0 dB. When used for random number generation, the gain amplifies the noise component of the analog signal. The output of the filter 7 is connected to analog to digital converter (ADC) 8. The output of the ADC 8 is connected to a digital signal processor which, among other tasks, ultimately performs the demodulation function. This digital signal processor is, referred to hereinafter as demodulator 9. The demodulated signal produced by the demodulator 9 is processed by other elements of the device. Those other elements are not shown in the figure. The output of the ADC 8 is also connected to a digital signal processing (DSP) unit 10. There may be a switch to disconnect either the demodulator 9 or the DSP 10 from the ADC 8. However, this is not a limitation and is not drawn in the figure.

Isolation means 6 may be implemented by a switch as illustrated, but other ways to implement the isolation means are possible (for example, disabling either the LNA, mixer or both). The isolation means 6 can temporarily isolate the antenna 1 from the analog processing unit 7 and the AD converter 8. This way, an input referred noise signal with a usually relatively small amplitude, is obtained due to the noise generating components internal to the analog processing unit 7.

The DSP 10 may comprise a sampling unit 11 to sample the values of the ADC. The DSP 10 may be configured to output a random number 12 based on the sampled values from the ADC. The sampling means 11 may be arranged for sampling the output values generated by the AD converter during the time period in which the antenna is isolated from the analog processing unit and the AD converter.

Further, the DSP 10 may be arranged for processing the sampled output values generated by the AD converter. Since the sampled output values of the ADC 8 have an inherent randomness, the values sampled by the sampling means 11 may be seen as random numbers.

The digital processing unit 10 may be configured to generate a random number based on one or more of the output values generated by the AD converter. For example, any non-random component that may be present in the sampled values, such as a DC component, may be eliminated by the DSP 10 to create a fully random number 12.

If the analog processing unit comprises a filter, the filter may be configured to operate at an increased filter bandwidth while the output values for random number generation are sampled. For example, the filter bandwidth is increased compared to a default operational mode of the device. This allows to obtain a sufficient amount of random information in a short time.

In principle, the antenna 1, the LNA 3, and the mixer 4 do not need to be present to generate random numbers. There may be configurations in which some or all of these components are not present at all. However, if they are present they are preferably all isolated from the analog signal processor 7 by isolation means 6. However, it is also possible to isolate only the antenna 1 without isolating the LNA 3 and the mixer 4 from the analog processing unit 7. In an alternative embodiment, only the LNA 3 and the antenna 1 are isolated, but the mixer 4 is not isolated from the analog signal processing means 7. For example, the mixer 4 is isolated from its input signal 5 instead. Moreover, in an alternative embodiment, the isolation may be achieved by switching off the LNA 3 or the mixer 4 altogether, so that the output of LNA 3 or mixer 4 is not dependent on received signals.

As explained above, the antenna 1 can be connected to the analog processing unit 7 via at least one of a low-noise amplifier (LNA) 3 and a mixer 4. The isolation means 6 can be configured to temporarily and simultaneously isolate the antenna and the at least one of the LNA 3 and the mixer 4 (usually both) from the analog processing unit 7 and the ADC 8, wherein the digital processing unit 10 is configured to process output values of the AD converter 8 sampled when the antenna 1 and the at least one of the LNA 3 and the mixer 4 (usually both) is isolated from the analog processing unit 7 and the ADC 8.

The digital processing unit 10 can be configured to base the random number on one or more of the least significant bits of the output values generated by the AD converter.

Many ways to generate the random number 12 exist. For example, the least significant bits of a plurality of sampled values may be concatenated to construct a random value having a predetermined number of bits. The value may be processed further to enhance its random properties.

The digital processing unit 10 can be configured to sample the output of the AD converter at time points that are separated from each other by at least a predetermined time duration. This time duration may be selected when designing or programming the digital signal processing unit 10, taking into account any autocorrelation in sequences of sampled values of the ADC. When the time period between samples is sufficient, this autocorrelation will in general be insignificant.

The analog/digital processing chain of a transceiver (LNA 3-mixer 4-switch 6-analog processing unit 7-ADC 8-demodulator 9) can be arranged to process polyphase signals (such as complex signals) having two or more (say N) signal components (for example, an I-component and a Q-component), which components are processed in N individual channels of the processing elements, respectively. These processing channels can have interdependencies. When performing polyphase operations/computations, the components generally depend on each other. However, this is not always the case. It is possible e.g. in a complex system (i.e. N=2) that the I processing channel and the Q processing channel are completely independent of each other. In the latter case, the DSP 10 can use the I samples and the Q samples as independent random values. However, if these processing channels have interdependency, then it may be useful to take this into account, for example in the DSP 10. This interdependency may be handled in numerous ways. Although examples are presented herein, these examples are not limiting in any way.

For example, the AD converter 8 can be configured to output values in an I-channel and in a Q-channel, and the digital processing unit is configured to determine the random number based on either one of the I-channel or Q-channel values.

The analog processing unit 7 and the analog to digital converter 8 can be capable of temporarily decoupling a processing path of the I-channel and a processing path of the Q-channel, for example under control of the DSP 10. The digital processing unit 10 can be configured to determine the random number based on both the I-channel and the Q-channel values when the processing paths are decoupled.

Further, to eliminate the effect of any periodicities, the sampling unit 11 can sample the output values generated by the AD converter 8 using a random sampling scheme. This sampling scheme determines the time points when the ADC 8 is sampled. For example this can be done by selecting index values of sample points randomly.

The sampling unit 11 can be configured to determine a sampling index for sampling the output value generated by the AD converter in dependence on a previous output value generated by the AD converter.

In a particular example, the digital processing unit 10 is configured to determine the sampling index for sampling the output value relating to a first channel and generated by the AD converter in dependence on a previous output value relating to a second channel and generated by the AD converter, wherein the first and second channel are different channels that are both selected from I-channel and Q-channel, and wherein the output value relating to the first channel is processed to generate a random number in dependence on the output value relating to the first channel.

In a particular example, the digital processing unit 10 is configured to determine the sampling index for sampling the output value relating to a first channel and generated by the AD converter. This sampling index may be determined in dependence on an output value relating to a second channel and generated by the AD converter, wherein the first and second channel are different channels from the plurality of channels. In a particular example, the first and second channel are both selected from I-channel and Q-channel.

The random number may be generated in dependence on the output value relating to the first channel.

Figure 2:
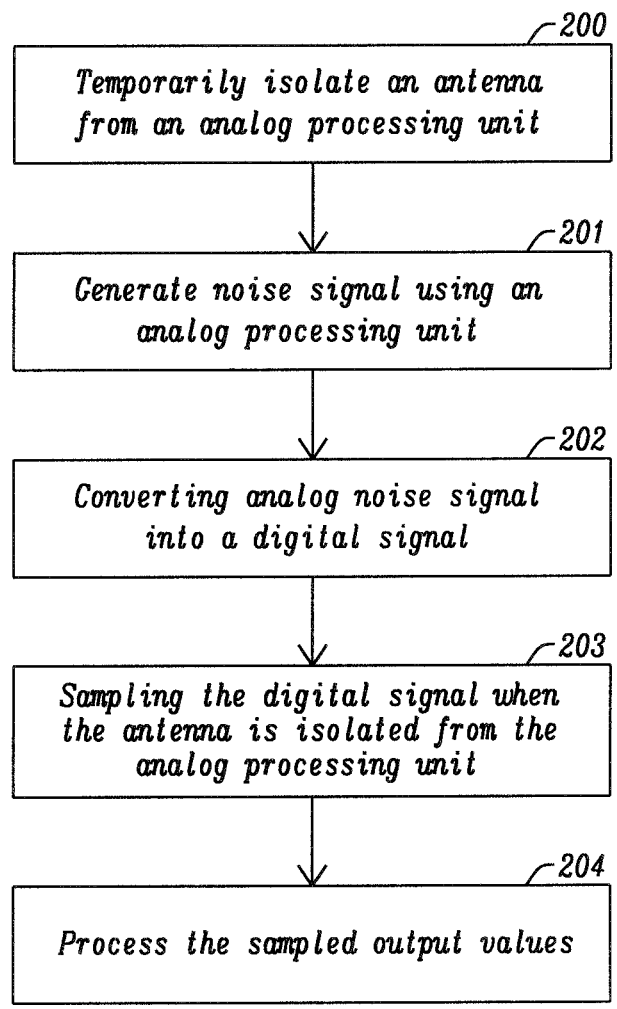
FIG. 2 is a flowchart illustrating a method for true random number generation.

FIG. 2 shows a flowchart illustrating a method for true random number generation. The method steps of the method may be performed concurrently or sequentially. The arrows indicate that information from one step is used by the next step.

Step 200 comprises temporarily isolating an antenna from an analog processing unit and an analog to digital (AD) converter. This antenna may be connected to that analog processing unit for processing (e.g. filtering) of received signals before and after being temporarily isolated.

Step 201 comprises generating a noise signal using an analog processing unit while temporarily isolating an antenna from the analog processing unit and an analog to digital (AD) converter.

Step 202 comprises converting an analog signal generated by the analog processing unit into a digital signal by the AD converter.

Step 203 comprises sampling the digital signal when the antenna is isolated from the analog processing unit and the AD converter to obtain sampled output values.

Step 204 comprises processing the sampled output values.

The method may be implemented as software to be executed by a device, for example a controller. The software causes the controller to control the following:

generating a noise signal using an analog processing unit by temporarily isolating an antenna from the analog processing unit and an analog to digital (AD) converter;

converting an analog signal generated by the analog processing unit into a digital signal by the AD converter;

sampling the digital signal when the antenna is isolated from the analog processing unit and the AD converter to obtain sampled output values; and processing the sampled output values.

Certain embodiments set forth herein may provide a way of generating a true random number in radio equipped SoCs
 without dedicated hardware
 in a timely manner (enough entropy)
 with enough randomness to satisfy FIPS 140-2 compliancy, using appropriate post-processing techniques, and/or
 with sufficient isolation from external signals to prevent tampering with the result.

Certain embodiments disclosed herein may be based on the hardware which is used for characterization of the radio performance. This hardware can be reused for capturing random bits. The characterization of the radio can however be implemented in various ways, and the concept of random number generation does not depend on specific implementation techniques or architectures.

According to certain embodiments disclosed herein, the the radio receive path may be used as a possible source of entropy for the generation of a seed good enough to operate as the basis for a symmetric key with an acceptable cryptographic strength. Built-In Self-Test (BIST) circuitry can be used to digitize the random values into readable numbers.

Figure 3:
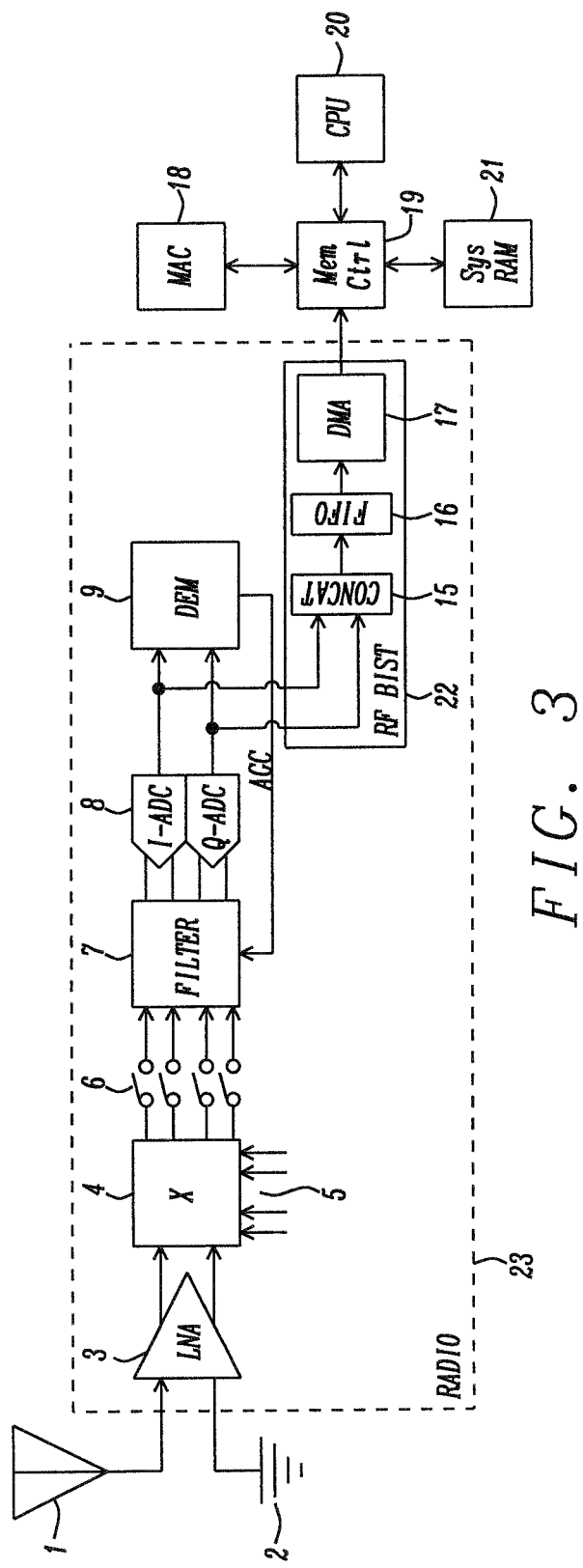
FIG. 3 is a diagram of another device for true random number generation.

FIG. 3 shows a receiver circuit with Built-In-Self-Test (BIST) circuitry 22. Items which are similar to the items appearing in FIG. 1 have been given the same reference numeral, and are not described further in the following. Such a BIST circuitry 22 is normally used to characterize the radio 23 reception quality. In the present disclosure, it is described how to use and/or modify such a BIST circuitry 22 for random number generation. The BIST circuitry 22 of FIG. 3 performs the main functions of the DSP unit 10 of FIG. 1.

The example circuit has I and Q data acquisition, storage, and post processing. Single channel circuits can also be made.

The BIST circuitry 22 of the present example has a configurable RX (reception) chain and has a data acquisition capability. These two features can be used to use the BIST circuit for random number generation.

The configurability of the BIST circuitry 22 means that the BIST circuitry 22 is able to control the enabling of individual blocks of the RX chain (for example, the LNA 3, Mixer 4, and/or synthesizer, which may provide input signal 5), set the state of test switches, including the switches 6 arranged between the mixer 4 and the filter 7. The BIST circuit 22 may further be able to decouple the I and Q paths, and bypass the Automatic Gain Control Loop, or other feedback loops and settings. Such configurability is used to isolate the circuits generating the random bits from the antenna 1, so as to eliminate the effects of potential attacks over the air.

Although each radio design can be different, in a particular example, a good trade-off between "robustness to attacks" and "high entropy" can be achieved by disabling the blocks up to and including the down conversion mixer 4 as well as the Local Oscillator (LO) signal (not shown) driving the mixer. Moreover, the Intermediate Frequency (IF)/Baseband amplifiers/filters (shown at block 7) to their maximum gain (or to a relatively high gain value).

The IF/Baseband path (filter block 7) may provide sufficient gain to bring the output noise floor of the IF/Baseband path above the quantization floor of the ADCs.

Further, a mechanism to acquire the outputs of I and Q ADCs (or another signal further along in the digital signal path) is proposed. In an example, those outputs are led via a parallel path into a concatenation block 15 which combines two I and Q bytes into individual 32-bit words. Following that, they are pushed into a FIFO 16 and/or a dedicated memory cell, e.g. dedicated memory array (DMA) 17. This data can be manipulated by generating a histogram and extract amplitude, DC-offset, integral non-linearity (INL) and differential non-linearity (DNL) values for the ADC 8, which may also entail implicitly evaluating the RF reception quality.

For illustration purpose, it is shown in FIG. 3 that the DMA 17 is connected to a memory control unit 19. Said memory control unit 19 is connected to a CPU 20 and system random access memory 21. Moreover, a media access control (MAC) unit 18 is connected to both the demodulator 9 and the memory control unit 19. These components are only shown as an illustrative example of how the true random number generator could be embedded in a system on a chip, for example.

The same circuitry of the BIST 22 can be used for capturing random noise when the RX chain is configured for "high robustness to attacks" and "high entropy", as described above.

The actual use of this technique to gather enough bits of entropy can be interleaved with the real time operation of the system. That means that one can initiate the seed generation while actually operating the radio for the respective application.

As was described above, the I/Q ADCs 8 may capture the output noise of the IF/Baseband path 7, while this path is set in a high enough gain setting. The noise may have a Gaussian distribution, but it is not necessarily white. It is possible that there is temporal coherence, or in other words its autocorrelation function may not be an impulse. In order to improve the independence of the noise samples, the sampling period may be configured to be longer than the coherence time. This way the samples will be substantially independent.

Since the outputs of the ADCs 8 can include DC offsets, an efficient way to get a random bit out of an ADC reading, without paying attention to the actual value of the reading, is to just keep the least significant bit (LSB) (or some of the least significant bits), which bit exhibits the highest variability and independence.

If after the configuration of the RX chain to function as a true random number generator (TRNG), there is still some effect of air interferers on the output of the ADCs 8, then a non-uniform, but random sampling can be adopted, to eliminate any harmonic relation to interferers. For example, random bits gathered from the Q path, could provide an index for the next sampling point of the I path. This way, since the Q-path generated index will still preserve some randomness, even in the presence of interferers, it will be extremely hard to predict how the I-path is affected by the interferers. Also, because of the isolation from the antenna, an interferer, if observable at all, is not expected to saturate the IF/Baseband path 7, so a linear addition of the interferer to the noise is considered. Again, keeping the LSB of the ADC readings can help eliminate any systematic effect of the interferers.

If both I and Q ADC readings are used in any way to extract the random bits, improvement in randomness can be gained if the complex IQ path (in case it is complex), can be configured as two parallel and independent paths, as often provided by a suitable test mode. This way the correlation between the I and Q paths due to their coupling can be eliminated. Again, keeping only the LSB of both I and Q can help mitigate this effect if no decoupling of the I and Q paths is possible.

Following the suggestion to keep the LSB of the ADC readings, and considering only one signal path (to account for topologies without a complex signal path), one bit per ADC reading is extracted. Then, as an example, consider a narrowband radio, with a channel bandwidth in the order of 1 MHz. Assuming that after for example 2 to 5 microseconds any temporal coherence effects have faded out (so that a new sample can be sampled every 2 microseconds), then the throughput of the proposed TRNG is 500 Kbits/sec. For radios with wider channel bandwidth the throughput can be increased proportionally. Additionally, a test mode that can increase the filter bandwidth can be considered if higher speeds are desired.

Depending on the randomness requirements and entropy of the ADC output, more bits can be considered out of every ADC reading, to directly increase the speed. Or the outputs or more parallel paths (like the I and Q paths in complex receivers) can be combined.

Some or all aspects of the invention may be suitable for being implemented in form of software, in particular a computer program product. Such computer program product may comprise a storage media, such as a memory, on which the software is stored. Also, the computer program may be represented by a signal, such as an optic signal or an electro-magnetic signal, carried by a transmission medium such as an optic fiber cable or the air. The computer program may partly or entirely have the form of source code, object code, or pseudo code, and may be suitable for being executed by a computer system. For example, the code may be executable by one or more processors.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

What is claimed is:

1. A device for true random number generation, comprising
    an analog processing unit for analog processing of a signal received from an antenna;
    an analog to digital (AD) converter for converting an analog signal generated by the analog processing unit into a digital signal;
    an isolation circuit for temporarily isolating the antenna from the analog processing unit and the AD converter to generate a noise signal;
    a sampling circuit for sampling output values generated by the AD converter when the antenna is isolated from the analog processing unit and the AD converter, wherein the output of the AD converter is sampled at time points that are separated from each other by at least a predetermined time duration, which time duration is longer than a time duration in which the output values of the AD converter exhibit a significant autocorrelation; and
    a digital processing unit for generating a random number based on one or more of the sampled output values generated by the AD converter.

2. The device of claim 1, wherein the analog processing unit comprises a filter having a gain larger than 0 dB.

3. The device of claim 1, wherein the filter is configured to operate at an increased filter bandwidth while the output values are generated.

4. The device of claim 1, wherein the antenna is connected to the analog processing unit via at least one of a low-noise amplifier (LNA) and a mixer, and wherein the isolation means is configured to temporarily and simultaneously isolate the antenna and the at least one of the LNA and the mixer from the analog processing unit and the ADC, wherein the digital processing unit is configured to process output values of the AD converter sampled when the antenna and the at least one of the LNA and the mixer is isolated from the analog processing unit and the ADC.

5. The device of claim 1, comprising a demodulator for demodulating the output values generated by the AD converter when the antenna is electrically connected to the analog processing unit.

6. The device of claim 1, wherein the digital processing unit is configured to base the random number on one or more selected bits of the output values generated by the AD converter.

7. The device of claim 1, wherein the AD converter is configured to output poly-phase values in a plurality of channels, and wherein the digital processing unit is configured to determine the random number based on values corresponding to a selected channel of the plurality of channels.

8. The device of claim 1, wherein the AD converter is configured to output poly-phase values in a plurality of channels, and wherein the analog processing unit and the analog to digital converter are capable of temporarily decoupling processing paths of the channels, and wherein the digital processing unit is configured to determine the random number based on the output values of the plurality of channels when the processing paths are decoupled.

9. The device of claim 1, wherein the digital processing unit is configured to sample the output values generated by the AD converter using a random sampling scheme.

10. The device of claim 7, wherein the digital processing unit is configured to determine a sampling index for sampling the output value generated by the AD converter in dependence on a previous output value generated by the AD converter.

11. The device of claim 8, wherein the digital processing unit is configured to determine the sampling index for sampling the output value relating to a first channel and generated by the AD converter in dependence on a previous output value relating to a second channel and generated by the AD converter, wherein the first and second channel are different channels that are both selected from I-channel and Q-channel, and wherein the output value relating to the first channel is processed to generate a random number in dependence on the output value relating to the first channel.

12. A method of generating a random number, comprising
generating a noise signal using an analog processing unit by temporarily isolating an antenna from the analog processing unit and an analog to digital (AD) converter;
converting an analog signal generated by the analog processing unit into a digital signal by the AD converter;
sampling the digital signal when the antenna is isolated from the analog processing unit and the AD converter to obtain sampled output values, wherein the output of the AD converter is sampled by a digital processing unit at time points that are separated from each other by at least a predetermined time duration, which time duration is longer than a time duration in which the output values of the AD converter exhibit a significant autocorrelation; and
generating a random number based on one or more of the sampled output values generated by the AD converter.

13. The method of generating a random number of claim 12, further comprising the step of:
providing a filter having a gain larger than 0 dB in the digital processing unit.

14. The method of generating a random number of claim 12, further comprising the step of:
operating the filter at an increased filter bandwidth while the output values are generated.

15. The method of generating a random number of claim 12, further comprising the steps of:
connecting the antenna to the analog processing unit via at least one of a low-noise amplifier (LNA) and a mixer,
isolating the antenna and the at least one of the LNA and the mixer from the analog processing unit and the ADC temporarily and simultaneously, and
processing by the digital processing unit, output values of the AD converter sampled when the antenna and the at least one of the LNA and the mixer is isolated from the analog processing unit and the ADC.

16. The method of generating a random number of claim 12, further comprising the steps of:
demodulating the output values generated by the AD converter by a demodulator when the antenna is electrically connected to the analog processing unit.

17. The method of generating a random number of claim 12, further comprising the step of:
basing the random number on one or more selected bits of the output values generated by the AD converter by the digital processing unit.

18. The method of generating a random number of claim 12, further comprising the steps of:
outputting by the AD converter, poly-phase values in a plurality of channels, and
determining by the digital processing unit the random number based on values corresponding to a selected channel of the plurality of channels.

19. The method of generating a random number of claim 12, further comprising the steps of:
outputting by the AD converter, poly-phase values in a plurality of channels,
decoupling temporarily by the analog processing unit and the analog to digital converter, processing paths of the channels, and
determining by the digital processing unit, the random number based on the output values of the plurality of channels when the processing paths are decoupled.

20. The method of generating a random number of claim 12, further comprising the step of:
sampling by the digital processing unit, the output values generated by the AD converter using a random sampling scheme.

21. The method of generating a random number of claim 18, further comprising the step of:
determining by the digital processing unit, a sampling index for sampling the output value generated by the AD converter in dependence on a previous output value generated by the AD converter.

22. The method of generating a random number of claim 19, further comprising the steps of:
determining by the digital processing unit, the sampling index for sampling the output value relating to a first channel and generated by the AD converter in dependence on a previous output value relating to a second channel and generated by the AD converter, wherein the first and second channel are different channels that are both selected from I-channel and Q-channel, and
processing the output value relating to the first channel, to generate a random number in dependence on the output value relating to the first channel.

23. A computer program product stored on a non-transitory tangible computer readable media, for being executed by a controller, the computer program causing the controller to control:
generating a noise signal using an analog processing unit by temporarily isolating an antenna from the analog processing unit and an analog to digital (AD) converter;
converting an analog signal generated by the analog processing unit into a digital signal by the AD converter;
sampling the digital signal when the antenna is isolated from the analog processing unit and the AD converter to obtain sampled output values, wherein the output of the AD converter is sampled by a digital processing unit at time points that are separated from each other by at least a predetermined time duration, which time duration is longer than a time duration in which the output values of the AD converter exhibit a significant autocorrelation; and
generating a random number based on one or more of the sampled output values generated by the AD converter.

* * * * *